(12) United States Patent
Shen

(10) Patent No.: US 8,962,395 B2
(45) Date of Patent: Feb. 24, 2015

(54) QFN PACKAGE AND MANUFACTURING PROCESS THEREOF

(71) Applicant: ChipMOS Technologies Inc., Hsinchu (TW)

(72) Inventor: Geng-Shin Shen, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 13/918,518

(22) Filed: Jun. 14, 2013

(65) Prior Publication Data

US 2013/0280865 A1 Oct. 24, 2013

Related U.S. Application Data

(62) Division of application No. 13/158,124, filed on Jun. 10, 2011, now abandoned.

(51) Int. Cl.
*H01L 21/00* (2006.01)
*H01L 23/00* (2006.01)
(Continued)

(52) U.S. Cl.
CPC ............ *H01L 24/11* (2013.01); *H01L 23/4951* (2013.01); *H01L 23/3107* (2013.01); *H01L 23/49551* (2013.01); *H01L 23/49861* (2013.01); *H01L 21/56* (2013.01); *H01L 21/561* (2013.01); *H01L 2224/16245* (2013.01); *H01L 2224/05569* (2013.01); *H01L 24/13* (2013.01); *H01L 24/16* (2013.01); *H01L 2224/05644* (2013.01); *H01L 2224/05647* (2013.01); *H01L 2224/05666* (2013.01); *H01L 2224/05684* (2013.01); *H01L 2224/13007* (2013.01); *H01L 2224/13022* (2013.01); *H01L 2224/13082* (2013.01);
(Continued)

(58) Field of Classification Search
CPC .................................................. H01L 23/4951
USPC ............................................................ 438/123
See application file for complete search history.

(56) References Cited

U.S. PATENT DOCUMENTS 6,867,072 B1 3/2005 Shiu et al.
7,112,871 B2 9/2006 Shiu et al.
(Continued)

FOREIGN PATENT DOCUMENTS

CN 101944496 A 1/2011
CN 102064154 A 5/2011
(Continued)

*Primary Examiner* — Ajay K Arora
(74) *Attorney, Agent, or Firm* — Muncy, Geissler, Olds & Lowe, P.C.

(57) ABSTRACT

The present invention provides a Quad Flat Non-leaded (QFN) package, which comprises a chip, a lead frame, a plurality of composite bumps and an encapsulant. The chip has a plurality of pads, and the lead frame has a plurality of leads. Each of the plurality of composite bumps has a first conductive layer and a second conductive layer. The first conductive layer is electrically connected between one of the pads and the second conductive layer, and the second conductive layer is electrically connected between the first conductive layer and one of the leads. The encapsulant encapsulates the chip, the leads and the composite bumps. Thereby, a QFN package with composite bumps and a semi-cured encapsulant is forming between the spaces of leads of lead frame before chip bonded to the lead frame are provided.

5 Claims, 9 Drawing Sheets

(51) Int. Cl.
  *H01L 23/31*  (2006.01)
  *H01L 23/498*  (2006.01)
  *H01L 21/56*  (2006.01)
  *H01L 23/495*  (2006.01)

(52) U.S. Cl.
  CPC ............... *H01L2224/13083* (2013.01); *H01L 2224/13109* (2013.01); *H01L 2224/13111* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13562* (2013.01); *H01L 2224/1357* (2013.01); *H01L 2224/13644* (2013.01); *H01L 2224/94* (2013.01); *H01L 2224/8191* (2013.01); *H01L 2224/05572* (2013.01)
  USPC ............ 438/123; 257/666; 257/790; 438/124

(56) References Cited

U.S. PATENT DOCUMENTS

| | | | |
|---|---|---|---|
| 7,615,851 B2 | 11/2009 | Lee et al. | |
| 7,691,681 B2 | 4/2010 | Lee | |
| 7,790,512 B1 | 9/2010 | Sirinorakul et al. | |
| 7,879,653 B2 | 2/2011 | Lin | |
| 7,880,313 B2 | 2/2011 | Lee et al. | |
| 8,569,887 B2 | 10/2013 | Hwang et al. | |
| 8,592,995 B2 | 11/2013 | Lin et al. | |
| 2002/0024053 A1* | 2/2002 | Inoue et al. | 257/79 |
| 2005/0073055 A1* | 4/2005 | Pan et al. | 257/778 |
| 2005/0077624 A1 | 4/2005 | Tan et al. | |
| 2006/0192295 A1* | 8/2006 | Lee et al. | 257/778 |
| 2006/0214308 A1 | 9/2006 | Yu et al. | |
| 2007/0001278 A1 | 1/2007 | Jeon et al. | |
| 2007/0108626 A1 | 5/2007 | Liu et al. | |
| 2008/0079149 A1 | 4/2008 | Hedler et al. | |
| 2009/0127680 A1* | 5/2009 | Do et al. | 257/675 |
| 2009/0189296 A1 | 7/2009 | Wu et al. | |
| 2009/0224385 A1 | 9/2009 | Chan et al. | |
| 2011/0031947 A1 | 2/2011 | You | |
| 2011/0101521 A1 | 5/2011 | Hwang et al. | |

FOREIGN PATENT DOCUMENTS

| | | |
|---|---|---|
| JP | 2005200444 | 7/2005 |
| TW | 530398 | 5/2003 |
| TW | I279887 | 4/2007 |
| TW | 200737472 | 10/2007 |
| TW | 200933853 | 8/2009 |

* cited by examiner

QFN PACKAGE AND MANUFACTURING PROCESS THEREOF

CROSS-REFERENCES TO RELATED APPLICATIONS

The present application is a divisional application of U.S. patent application Ser. No. 13/158,124 filed on Jun. 10, 2011, the disclosure of which is incorporated by reference herein in its entirety.

BACKGROUND OF THE INVENTION

1. Field of the Invention

The present invention relates to a QFN package and manufacturing process thereof, and more particularly, to a QFN package with composite bumps.

2. Descriptions of the Related Art

Semiconductor packaging processes have been widely used to electrically connect a semiconductor chip to an external component with a better reliability and also to protect the semiconductor chip from damages caused by external conditions. However, packaging materials and the packaging processes used are not only associated with the manufacturing cost, but also have an influence on operational performance of the packaged chip. For this reason, the packaging structure and materials thereof selected for use become very important.

Among several package technologies, Quad Flat No-Leaded (QFN) semiconductor packages have achieved wide popularity in recent years because of their smaller package size. In a conventional QFN semiconductor package, a chip is electrically connected to a lead frame by wire, with each bond pad of the chip being electrically connected to a corresponding lead of the lead frame respectively. As to a flip chip QFN package 10, a chip 101 is electrically connected to a lead frame 103 by bumps 105 as shown in FIG. 1A or FIG. 1C. The chip 101 is flipped and bonded on the lead frame 103 by solder joining of solder bump (FIG. 1A) or copper pillar with solder cap. Due to reflow for melting the solder bump or solder cap on copper pillar to solder join the bump 105 of chip 101 and lead of lead frame 103, the lead width will be limited to enough space for avoid the melting solder over flow to the opposite side of lead during the reflow process (FIG. 1B). That melting solder 107 over flow on the opposite side of lead will induce assembly defect of further process, for example encapsulation, or SMT (Surface Mount Technology).

Unfortunately, sometimes limitation of chip size and package size, the lead width may not be designed with enough space to avoid the melting solder over flow. In view of this, it is highly desirable in the art to provide a solution that can improve the limitation of lead width and also provide a lower the manufacturing cost of a packaging structure.

SUMMARY OF THE INVENTION

The primary objective of the present invention is to provide a Quad Flat Non-leaded (QFN) package, which comprises a chip, a lead frame, a plurality of composite bumps and an encapsulant. The chip has a plurality of pads, and the lead frame has a plurality of leads. A semi-cured encapsulant is formed in the spaces between the leads of the lead frame before the chip is bonded to the lead frame. Each of the plurality of composite bumps has a first conductive layer and a second conductive layer. The first conductive layer is electrically connected between one of the pads and the second conductive layer, and the second conductive layer is electrically connected between the first conductive layer and one of the leads. The encapsulant encapsulates the chip, the leads and the composite bumps. Thereby, a QFN package with composite bumps and a semi-cured encapsulant, formed in the spaces between the leads of the lead frame before the chip is bonded to the lead frame, are provided.

To provide the aforesaid QFN package, the manufacturing process of the present invention comprises the following steps of: forming a plurality of lead frame module; forming a plurality of chip modules, each having a chip being connected with a plurality of composite bumps; bonding the lead frame modules to the chip modules by connecting the composite bumps to the leads respectively; and forming a plurality of QFN packages by encapsulating and singulating the chip modules and the lead frame modules.

When adapting thermo-ultrasonic bonding, the step of forming a plurality of lead frame modules comprises the following steps of: forming an upper unit by semi cured encapsulant onto a top carrier; forming a lower unit by disposing a matrix lead frame on a bottom carrier, wherein the matrix lead frame comprises a plurality of leads; bonding the upper unit and the lower unit by laminating the semi cured encapsulant with the matrix lead frame to have the leads be in contact with the top carrier; forming the plurality of lead frame modules by fully curing the encapsulant and removing the top carrier to make sure the top surface of lead is not lower than the encapsulant. It should be noted that the step of bonding the lead frame modules to the chip modules may be proceeded by one of thermo-ultrasonic bonding, reflowing and applying conductive paste.

As compared to the prior art, the present invention provides the following benefits: the QFN package and a manufacturing process thereof of the present invention replaces the conventional bumps with the composite bumps and a encapsulated matrix lead frame, so the pitch between and the height of the composite bumps of the QFN package could be controlled, and the short interconnection loop formed by the composite bumps could reduce the resistance and inductance and improve the performance of the whole QFN package.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following descriptions, this invention will be explained with reference to embodiments thereof, which relate to a QFN package and a manufacturing process thereof.

However, these embodiments are not intended to limit this invention to any specific environment, applications or particular implementations described in these embodiments. Therefore, descriptions of these embodiments are only for illustration purposes rather than limitation. It should be appreciated that in the following embodiments and the attached drawings, elements unrelated to this invention are omitted from depiction; and dimensional relationships among individual elements in the attached drawings are depicted in an exaggerative way for ease of understanding.

Figure 1A:
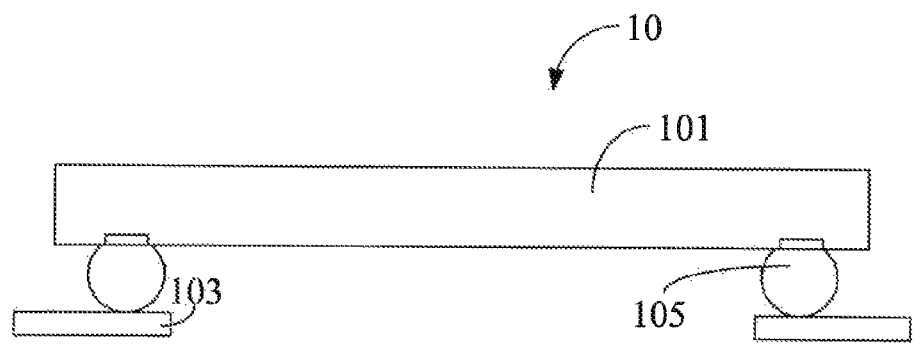
FIG. 1A to FIG. 1C are schematic views of conventional flip chip QFN packages.
Figure 1B:
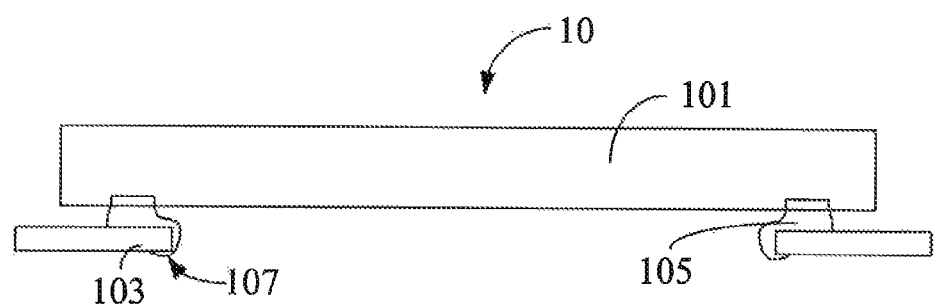
Figure 1C:
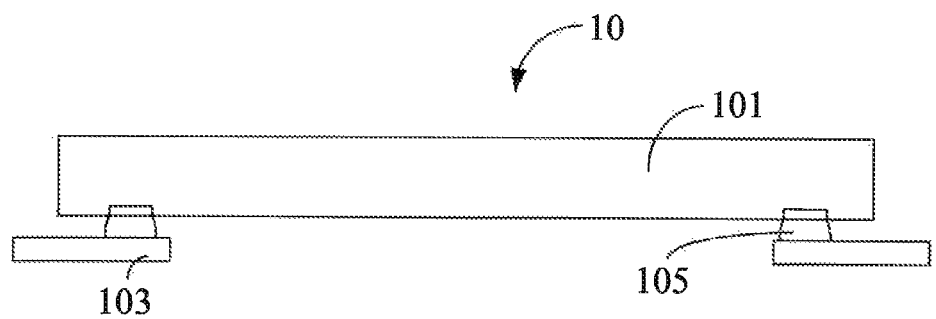
Figure 2A:
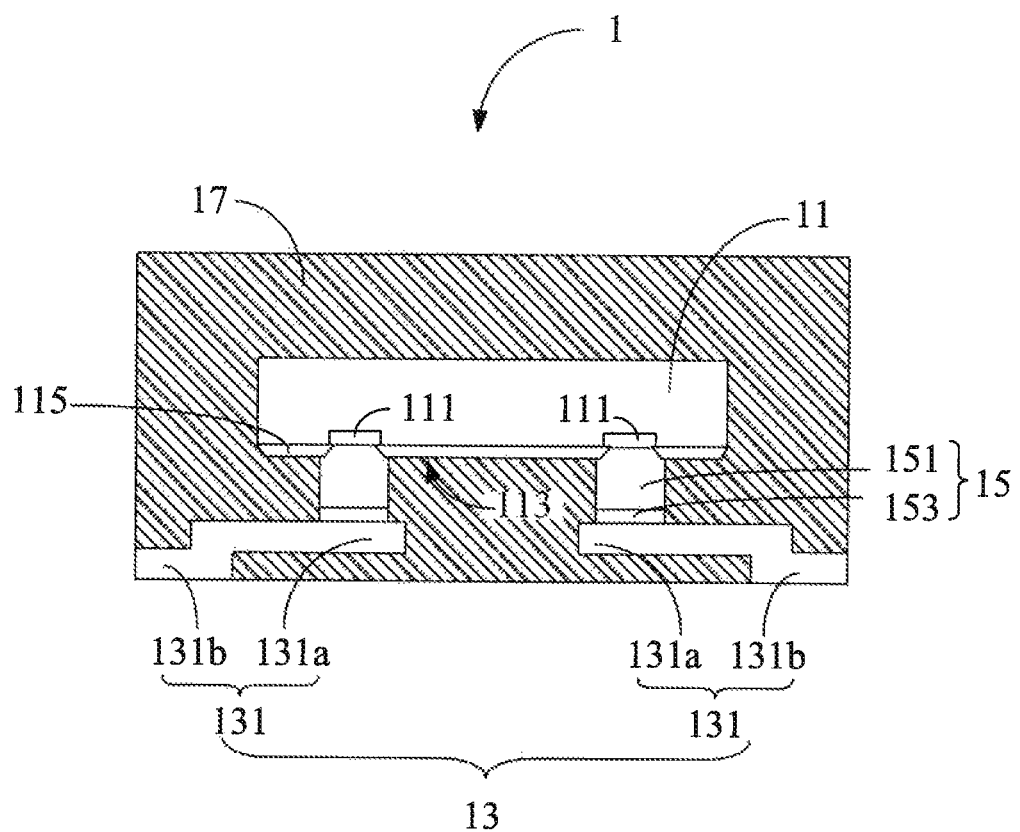
FIG. 2A is a cross sectional view of a QFN package structure in accordance with a preferred embodiment of the present invention.

Referring to FIG. 2A, a preferred embodiment of a Quad Flat Non-leaded (QFN) package 1 in accordance with the present invention is shown therein. The QFN package 1 comprises a chip 11, a lead frame 13, a plurality of composite bumps 15 and an encapsulant 17.

The chip 11 has an active surface 113, a plurality of pads 111 and a passivation layer. The pads 111 are formed on the active surface 113 of the chip 11. More specifically, the pads 111 are arranged at four sides of the active surface 113, and the pads 111 may be only arranged at two parallel sides of the active surface 113 in other aspects. Each of the pads 111 is partially covered by the passivation layer 115, and some portion of each of the pads 111 is exposed for electrical connection thereby. In the present invention, the chip 11 may be, for example, a display driver circuit IC, an image sensor IC, a memory IC, a logic IC, an analog IC, an ultra-high frequency (UHF) or a radio frequency (RF) IC, but it is not limited thereto.

The lead frame 13 has a plurality of leads 131, which are arranged at four sides to form a square in this embodiment (not shown). Each lead 131 has an inner lead portion 131a and an outer lead portion 131b. Each of the inner lead portions 131a and each of the outer lead portions 131b have a height difference that the inner lead portions 131a are higher than the outer lead portions 131b as shown in FIG. 2A.

The composite bumps 15 are electrically connected between the chip 11 and the lead frame 13. Each composite bump 15 has a first conductive layer 151 and a second conductive layer 153, and the second conductive layer 153 is softer than the first conductive layer 151. The first conductive layer 151 is electrically connected between a corresponding pad 111 of the pads 111 of the chip 11 and the second conductive layer 153. The second conductive layer 153 is electrically connected between the first conductive layer 151 and a corresponding inner lead portion 131a of the inner lead portions 131a of the leads 131 of the lead frame 13. As a result, the composite bumps 15 electrically connect to the pads 111 of the chip 11 with the first conductive layers, and the composite bumps 15 electrically connect to the inner lead potions 131a of the leads 131 of the lead frame 13 with the second conductive layers 153. The first conductive layer 151 may be made of a material selected from a group consisting of copper, nickel, aluminum, zinc, and combinations thereof. The second conductive layer 153 may be made of a material selected from a group consisting of gold, copper, silver, tin, zinc, indium, and combinations thereof. The second conductive layer 153 made of gold forms a thickness which is at least less than a half of the total height of the composite bump 15. The reduction of gold results in reducing the manufacture cost.

It shall be noted that, the composite bumps 15 disclosed above are only provided as an example, and as may be appreciated by those of ordinary skill in the art, the composite bumps 15 may also be "composite" bump structures formed by other existing bumps in combination (for example, the composite bumps are formed by two layers of stud bumps) to satisfy different demands for electrical connection between different kinds of flip chips and the substrate and to lower the manufacturing cost by reducing use of gold.

The encapsulant 17 encapsulates the chip 11, the leads 131 and the composite bumps 15. In this embodiment, the encapsulant 17 is fainted around the chip 11 and the composite bumps 15 and covers almost the whole surface of the lead frame 13 except for the bottom surface of outer lead portion 131b of lead 131 of lead frame 13 thereof. The material of the encapsulant 17 is a material of Which may be selected from thermoplastic resins such as acrylic resins, polyimide resins or polysulfone resins, or thermosetting resins such as epoxy resins, phenolic resins, tripolycyanamide resins or polyester resins, or combinations thereof. Furthermore, the encapsulant 17 is preferably made of low coefficient of thermal expansion (CTE) and low modulus material.

Each of the composite bumps 15 connects to the top surface of the corresponding inner lead portion 131a of the lead 131 of the lead frame 13 by thermo-ultrasonic bonding, reflowing, or applying conductive paste therebetween. In this embodiment, the composite bumps 15 connect to the leads 131 by thermo-ultrasonic bonding. In another aspect of the present invention, the QFN package further comprises a plurality of plated structures, one of which is adhered between the second conductive layer and the lead for connecting each of the composite bumps to the corresponding inner lead portion of the lead of the lead frame by reflowing. The encapsulant of such modification would not have any encapsulation interface. The plated structure is solder or a copper pillar with a solder cap. Moreover, in a further aspect of the present invention, the QFN package further comprises a plurality of conductive paste, respectively disposed between and adhering each of the composite bumps and a corresponding lead of the leads. The conductive paste may be silver paste or solder. Neither the encapsulant of such modification would have any encapsulation interface.

Figure 2B:
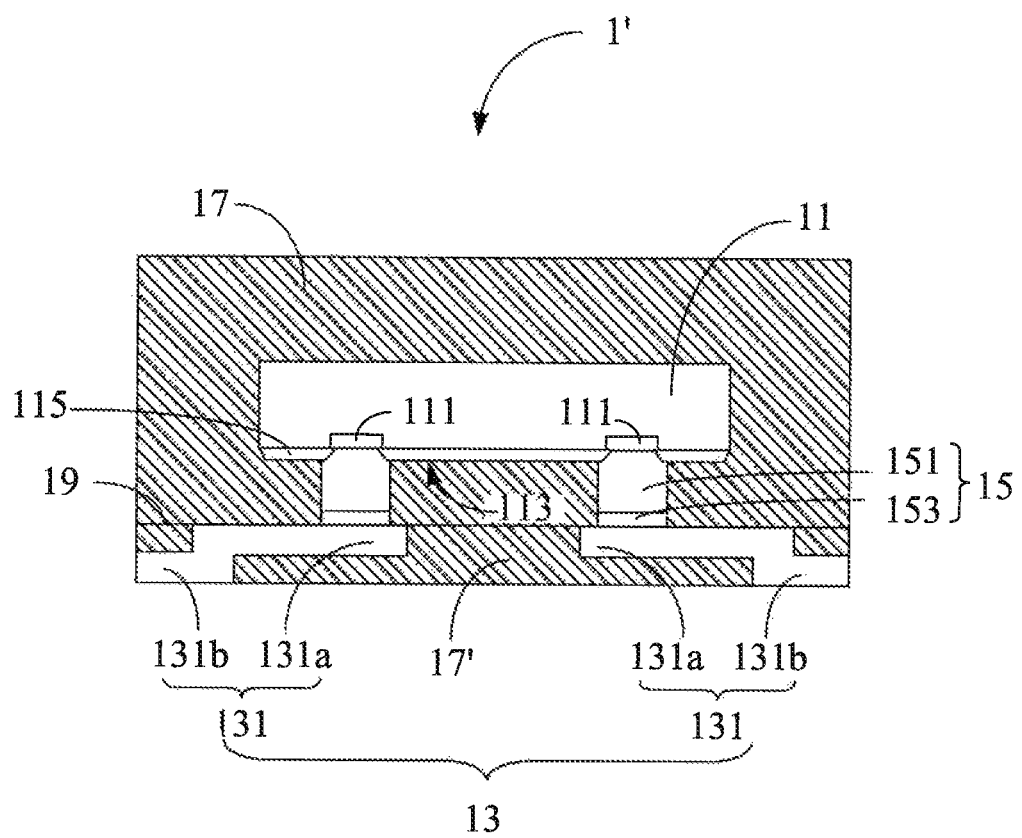
FIG. 2B is a cross sectional view of another QFN package structure in accordance with a preferred embodiment of the present invention.

It should be noted that there would be thermal stress arisen after thermo-ultrasonic boding, and the top surface of the inner lead portion 131a would be bent, cracked or even fractured. Meanwhile, if a low melting temperature soft melt material is applied for solder (not shown) to join the bump 15 and inner lead portion 131a of lead 131 of lead frame 13, the soft melt material would overflow and induce some defects in further assembly process. To avoid such defects, the present invention further provides a QFN package which adopts specific manufacturing process and would be describe in detail later, further has an encapsulation interface 19 which is not higher than a top surface of the lead frame 13 as shown in FIG. 2B. In more detail, the encapsulant 17 is only formed around the chip and the composite bump, fully cured encapsulant 17' is formed around the leads 131 of the lead frames 13 under the encapsulant 17, and the interface between the encapsulant 17 and the fully cured encapsulant 17' is the encapsulation interface Hereinbelow, the manufacturing process for manufacturing the QFN packages of the abovementioned embodiment of the present invention will be detailed with reference to the above descriptions, the attached drawings FIGS. 3A-3E, 4A-4C, 5A-5B. It shall be noted that, for simplicity of the description, the manufacturing process for manufacturing the QFN packages will be described with only one chip as a representative example in the following descriptions and the attached drawings, and the material or related description of the elements is the same as above-mentioned and is omitted.

Figure 3A:
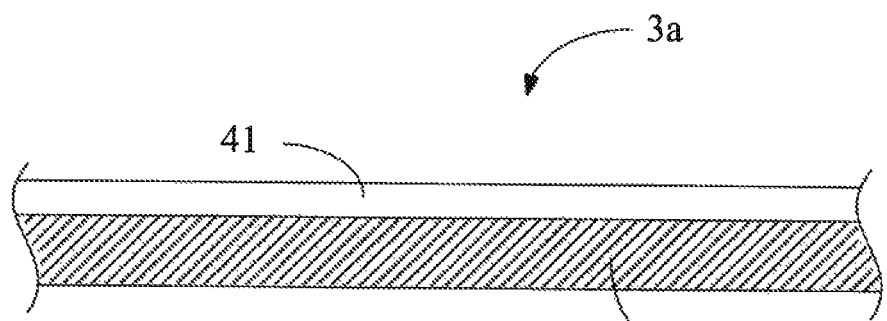
FIG. 3A to FIG. 3E are schematic views illustrating a manufacturing process of a lead frame module of a QFN package in accordance with an embodiment of the present invention.
Figure 3B:
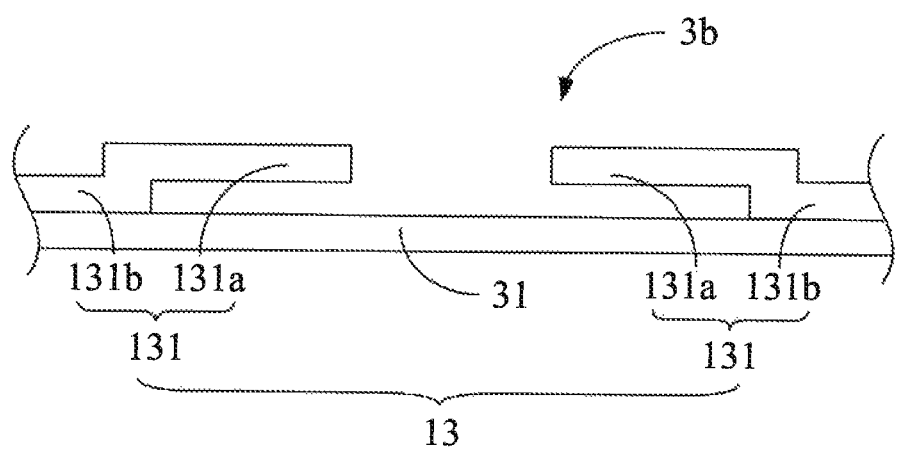
Figure 6:
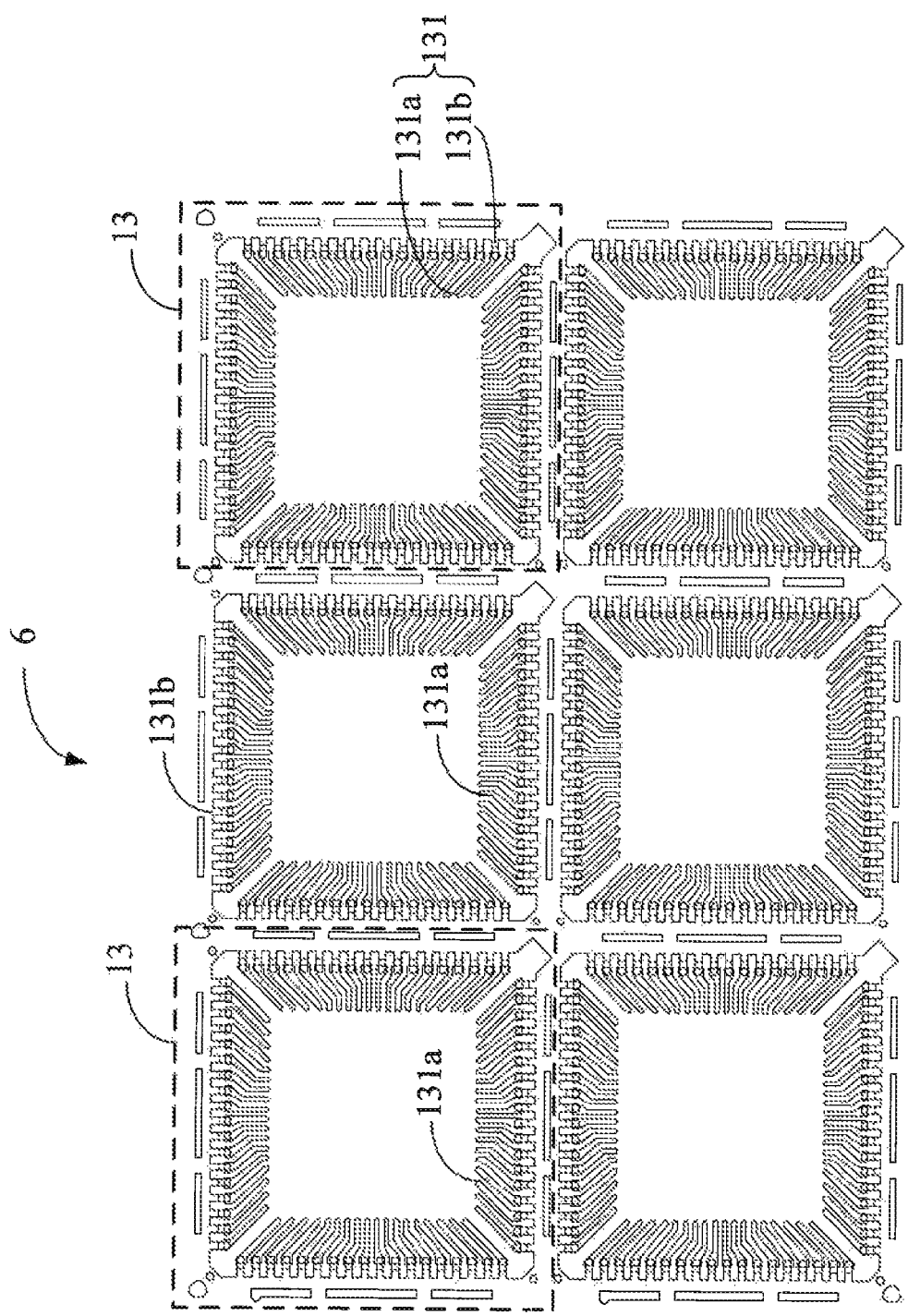
FIG. 6 is a schematic view of a matrix lead frame of the present invention.

Instead of providing a matrix lead frame in the well-known manufacturing process of QFN packages, a plurality of lead frame modules are provided by pre-molding in this specific manufacturing process. Referring to FIG. 3A, as shown therein, forming an upper unit 3a by forming a semi cured encapsulant 17" onto a top carrier 41 is executed. A top carrier 41 could be metal, glass, organic film, or plastic, which could provide a flat surface and appropriate strength for the semi cured encapsulant 17". Then, FIG. 3B shows that a lower unit 3b is formed by disposing a matrix lead frame 6 (as shown in FIG. 6) on a bottom carrier 31, which could be organic film, glass, plastic, or metal. As shown in FIG. 313 and FIG. 6, the matrix lead frame 6 comprises a plurality of lead frames 13, each of the lead frames 13 comprises a plurality leads 131, and each lead 131 has an inner lead portion 131a and an outer lead portion 131b. Appropriate adhesion between the bottom carrier 31 and the lead frame 13 is necessary for further process. It should be noted that the executing priority of the processes illustrated in FIG. 3A and FIG. 3B are not limited.

Figure 3C:
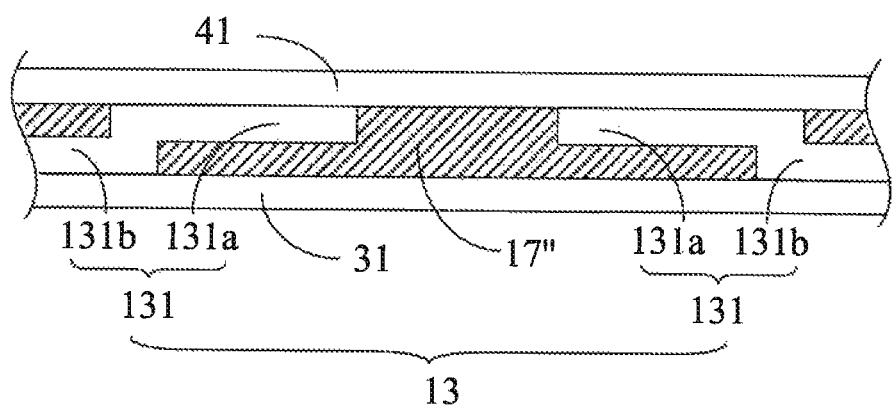

Then, FIG. 3C features that bonding the upper unit 3a and the lower unit 3b by laminating the semi cured encapsulant 17" with the matrix lead frame to have the leads 131 be in contact with the top carrier 41. In more detail, the top carrier 41 contacts the top surface of the inner lead portions 131a of the leads 131. Since the semi cured encapsulant 17" is partially cured and is a semifluid substance, the leads 131 would be enclosed except for the top surface of the inner lead portions 131a and the bottom surface of the outer lead portions 131b.

Figure 3D:
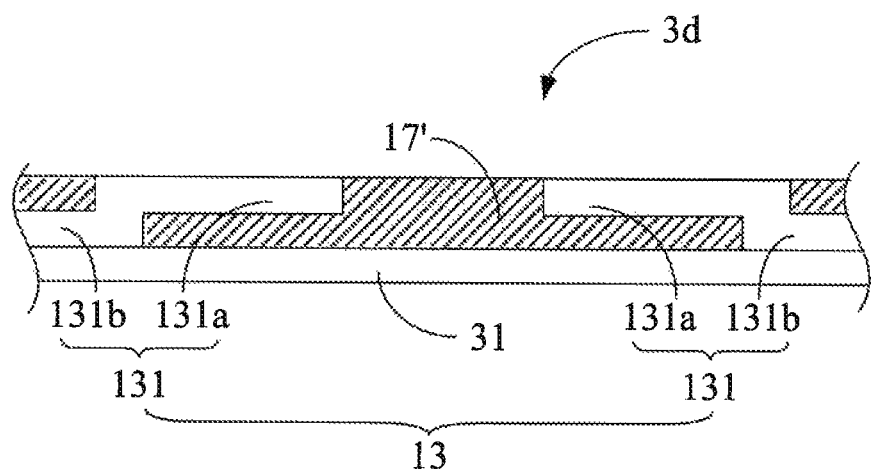
Figure 3E:
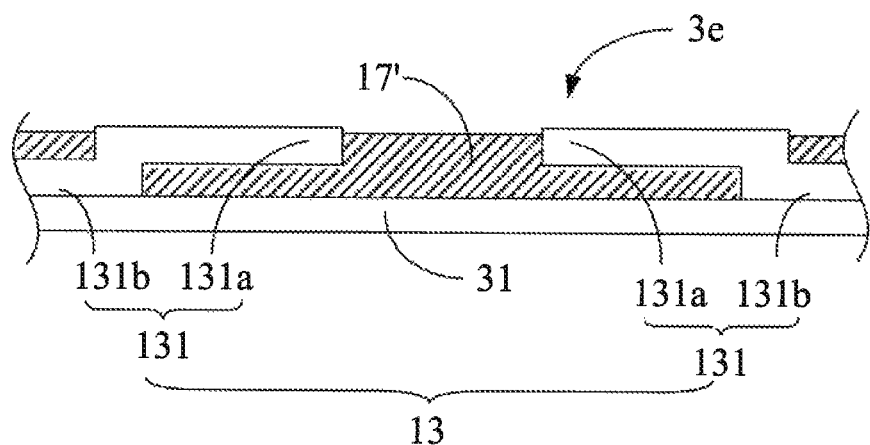

Next, referring to FIG. 3D, as shown therein, forming a lead frame module 3d (or 3e shown in FIG. 3E) on each lead frame 13 of the matrix lead frame by fully cured the semi cured encapsulant 17" to fully cured encapsulant 17' and removing the top carrier 41. After removing the top carrier 41, the top surface of the fully cured encapsulant 17' may be as high as (or lower than shown in FIG. 3E) the top surface of the inner lead portions 131a of the leads 131. Thereby, the lead frame module 3d (or 3e shown in FIG. 3E) on the matrix lead frame is formed.

Figure 4A:
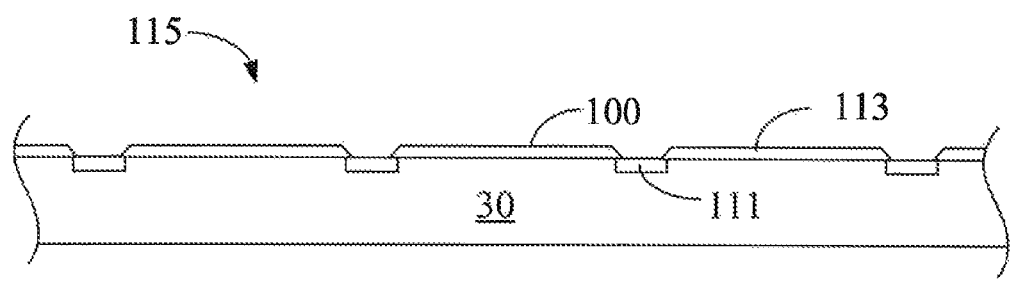
FIG. 4A to FIG. 4C are schematic views illustrating a manufacturing process of a chip, electrically connected with plural composite bumps, of a QFN package in accordance with an embodiment of the present invention.

Referring to FIG. 4A, as shown therein, a wafer 30 is provided. The wafer 30 is formed with internal circuits, an active surface 113, a plurality of pads 111 and a passivation layer 115. The pads ill are disposed on the active surface 113 and are partially covered by the passivation layer 115 to provide exposed areas (or named "openings"). Signals would be transmitted from or to the internal circuits through the exposed areas of the pads 111.

Figure 4B:
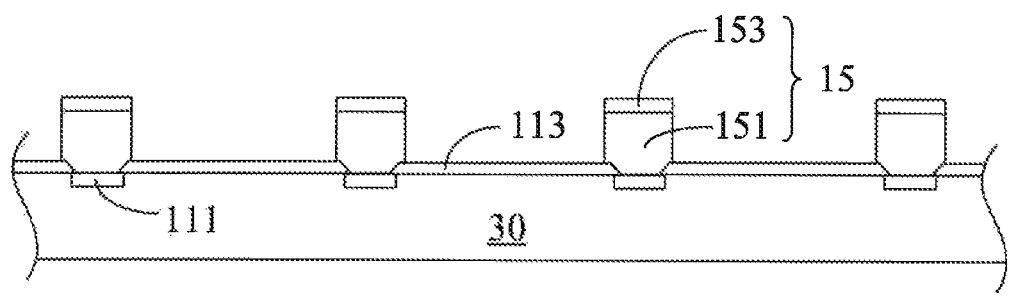
Figure 4C:
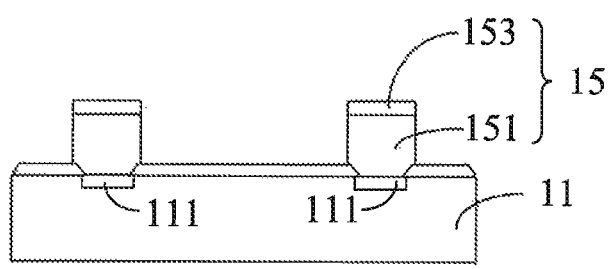

Referring to FIG. 4B, as shown therein, forming a composite bump 15 on each of the pads 111 is executed. Each of the composite bumps 15 comprises a first conductive layer 151 and a second conductive layer 153, and the first conductive layer 151 is directly connected to and disposed between a corresponding pad 111 of the pads 111 and the second conductive layer 153. Thereby, the internal circuits of the wafer 30 and the composite bumps 15 are electrically connected via the exposed areas of the pads 111. Then, as shown in FIG. 4C, the wafer 30 is saw to provide a plurality of chips 11, each of which is electrically connected with plural composite bumps 15. As will be appreciated by those of ordinary skill in the art upon reviewing the above descriptions, other existing processes for composite bumps may also be applied in the present invention, and this will not be further described herein.

Figure 5A:
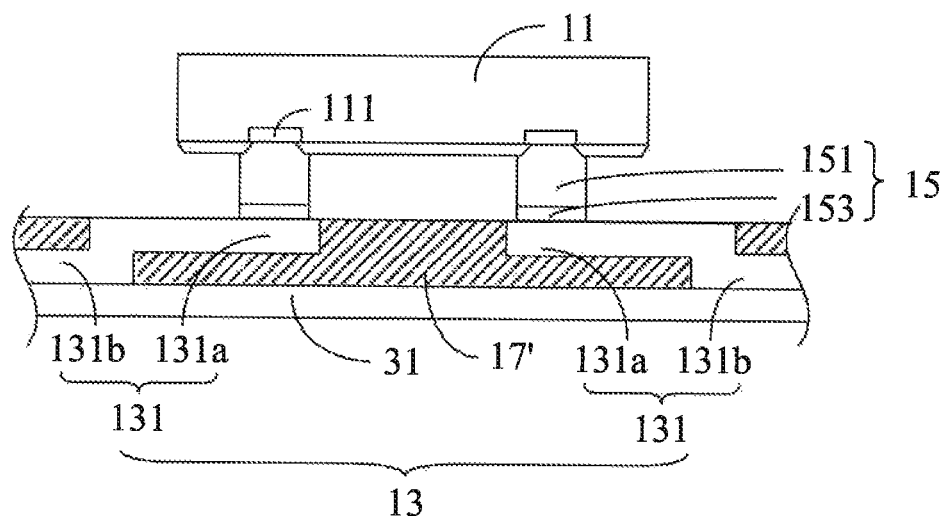
FIG. 5A to FIG. 5B are schematic views illustrating a manufacturing process of a QFN package in accordance with an embodiment of the present invention.

On the other hand, a plurality of lead frame module, which is disposed and formed on the matrix lead frame 6 on a bottom carrier 31, is provided according to the steps FIGS. 3A-3E. The matrix lead frame 6 (as shown in FIG. 6) comprises a plurality of lead frames 13, and each of the lead frames 13 has a plurality of leads 131 as depicted above. And the leads 131 of the matrix lead frame 13 are enclosed with the fully cured encapsulant 17' except for the top surface of the inner lead portions 131a and the bottom surface of the outer lead portions 131b. FIG. 5A shows the following step that bonding each of the chips 11 to a corresponding plurality of leads 131 of the lead frames 13 of lead frame module on the matrix lead frame with composite bumps 15. Each of the chips 11 is electrically connected to a part of the leads 131 of the matrix lead frame by a plurality of composite bumps 15. The second conductive layer 153 of each composite bump 15 is directly connected to the top surface of the inner lead portion 131a of the corresponding lead 131 of the lead frame 13 by thermo-ultrasonic bonding, reflowing or applying conductive paste. It is known that there would be solder between the composite bumps 15 and the inner leads 131a, and such solder is not shown in FIG. 5A if reflow is applied.

Figure 5B:
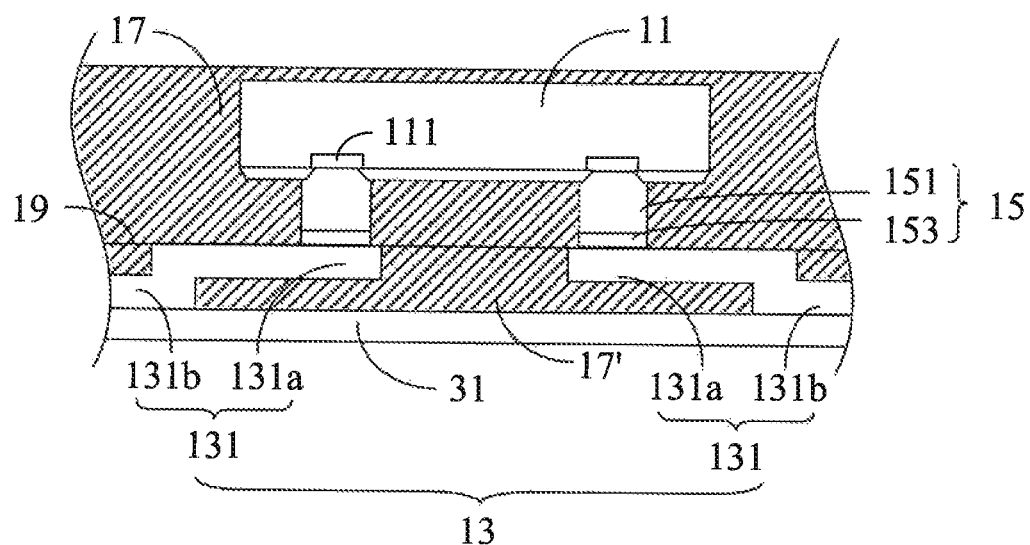

Then, as shown in FIG. 5B, the chip 11, the lead frames 13 on the matrix ad frame and the composite bumps 15 are encapsulated. The encapsulant 17 is formed around the chip 11 and the composite bumps 15 and covers almost the whole surface of the lead frame 13 except for the bottom surface of outer lead portion 131b of lead 131 by transfer molding, screen printing, coating, or injection, etc. The encapsulation interface 19 would be formed in such case, no matter whether the encapsulant 17 is the same material as the fully cured encapsulant 17' or not. Finally, singulating the matrix lead frame and stripping off the bottom carrier 31 to the QFN packages 1 is executed as shown in FIG. 2. The QFN package 1 comprises one of the encapsulated chips 11 and a part of the encapsulated matrix lead frame.

Figure 7:
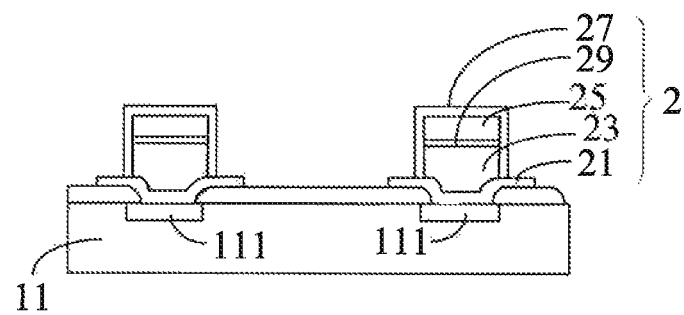
FIG. 7 is a cross sectional view of a composite bump in accordance with another aspect of the preferred embodiment of the present invention.

When adapting thermo-ultrasonic bonding, there would be thermal stress arisen after thermo-ultrasonic boding, and the top surface of the inner lead portion 131a would be not bent, cracked or even fractured. And no more melting solder overflows in the present invention In other aspect, the composite bump may further comprise at least an under bump metallization (UBM) layer, or a covering third conductive layer and a barrier layer. Referring to FIG. 7, as shown therein, the chip 11 is electrically connected to plural composite bumps through plural pads 111. Each of the composite bumps 2 comprises an under bump metallization (UBM) layer 21, a first conductive layer 23, a second conductive layer 25, a covering third conductive layer 27 and a barrier layer 29. The UBM layer 21 is disposed between the first conductive layer 23 and the pad 111 of the chip 11. The first conductive layer 23 is located on the UBM layer 21, and the second conductive layer 25 is in turn located on the first conductive layer 23. The covering third conductive layer 27 that covers the surface each of the composite bumps 2, which includes the second conductive layer 25, and the first conductive layer 23. The barrier layer 29 located between the first conductive layer 23 and the second conductive layer 25. The UBM layer 21 may be made of a material selected from titanium, tungsten, copper, gold, and alloys thereof. The covering third conductive layer 27 may be made of gold, but it is not limited thereto. The barrier layer 29 may be made of nickel, but it is not limited thereto.

Figure 8:
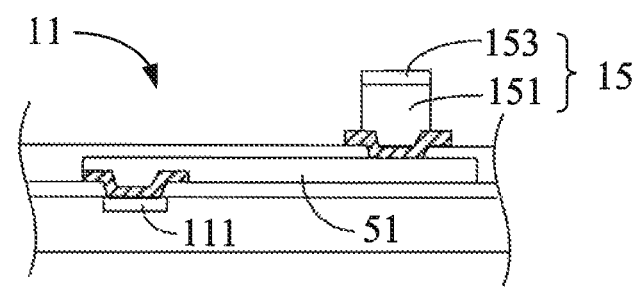
FIG. 8 is a cross sectional view of a chip in accordance with another aspect of the preferred embodiment of the present invention.

Moreover, the step of forming the wafer 30 shown in FIG. 4A may further comprises the following steps of forming a redistribution layer (RDL) 51 on each of the pads 111 of the chips 11 for electrical connection between the first conductive layer 151 of each of the composite bumps 2; and forming the composite bump 15 by forming a first conductive layer 151 on each of the RIM layers 51 and forming a second conductive layer 153 on the first conductive layer 151 to re-layout the bump position as shown in FIG. 8.

With the composite bumps, the pitch between and the height of the composite bumps 15 of the QFN package 1 could be controlled, and the short interconnection loop formed by the composite bumps 15 could reduce the resistance and inductance and improve the performance of the whole QFN package. Moreover, pre-molding the lead frame could avoid the different leveling issue of inner lead portions and protect the lead surface.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A manufacturing process for Quad Flat Non-leaded (QFN) packages, comprising the steps of:
    forming an encapsulated lead frame module, comprising the step of:
       forming an upper unit by forming a semi-cured encapsulant onto a top carrier;
       forming a lower unit by disposing a matrix lead frame on top of a bottom carrier, wherein the matrix lead frame has a plurality of leads, each of the plurality of leads has at least a top horizontal part having a first intermediate vertical surface, a first intermediate horizontal surface and a top horizontal surface, and a bottom horizontal part having a second intermediate vertical surface, a second intermediate horizontal surface and a bottom horizontal surface, the top horizontal surface contacts the top carrier, the bottom horizontal surface contacts the bottom carrier, the first intermediate vertical surface is formed between the top horizontal surface of the top horizontal part and the second intermediate horizontal surface of the bottom horizontal part, the second intermediate vertical surface is formed between the first intermediate horizontal surface of the top horizontal part and the bottom horizontal surface of the bottom horizontal part, the top horizontal part and the bottom horizontal part overlap with, but offset from, each other, a vertical direction being a direction normal to the bottom horizontal surface;
    bonding the upper unit on top of the lower unit by laminating the semi-cured encapsulant with the matrix lead frame, such that the semi-cured encapsulant contacts the first intermediate horizontal surface and the first intermediate vertical surface of the top horizontal part and the second intermediate horizontal surface and the second intermediate vertical surface of the bottom horizontal part;
    curing the semi-cured encapsulant to a fully cured encapsulant;
    removing the top carrier to form the encapsulated lead frame module, wherein the fully cured encapsulant is not higher than the top horizontal surface of the leads of the matrix lead frame;
 bonding a plurality of chips on the matrix lead frame of the encapsulated lead frame module, each of the chips being electrically connected to a part of the leads of the matrix lead frame by a plurality of bumps on each of the chips;
 subsequently encapsulanting the chips and the bumps, wherein a second encapsulant is formed around the chips and the bumps and covers an uppermost surface of the encapsulated lead frame module; and
 forming a QFN package by singulating the encapsulated chips and the encapsulated lead frame module, wherein the QFN package comprises one of the encapsulated chips and bumps along with a part of the encapsulated matrix lead frame.

2. The manufacturing process as claimed in claim 1, wherein each of the leads has an inner lead portion and an outer lead portion, and a bottom surface of the inner lead portion of each of the leads is higher than a bottom surface of the outer lead portion of each of the leads.

3. The manufacturing process as claimed in claim 1, wherein each of the bumps is a composite bump, including a first conductive layer and a second conductive layer, which is softer than the first conductive layer.

4. The manufacturing process as claimed in claim 2, wherein each of the chips is electrically connected to a top surface of the inner lead portions of the part of the leads of the matrix lead frame.

5. The manufacturing process as claimed in claim 1, wherein the plurality of bumps are directly connected to the leads of the matrix lead frame by thermo-ultrasonic bonding.

* * * * *